(12) United States Patent
Park et al.

(10) Patent No.: US 9,348,060 B2
(45) Date of Patent: *May 24, 2016

(54) POLYMERIC TRIARYLMETHANE DYE, BLUE RESIN COMPOSITION INCLUDING FOR COLOR FILTER INCLUDING THE POLYMERIC DYE AND COLOR FILTER USING THE RESIN COMPOSITION

(71) Applicant: KYUNG-IN SYNTHETIC CO., LTD., Seo-gu Incheon (KR)

(72) Inventors: Soonhyun Park, Suwon-si (KR); Jung Rok Kim, Suwon-si (KR); Jeong Gi Kim, Ansan-si (KR); Hyun Jae Chun, Seoul (KR); Do Kyung Lee, Incheon (KR); Min-Jung Lee, Seoul (KR); Youna Lee, Seoul (KR)

(73) Assignee: Kyung-In Synthetic Co., Ltd., Seo-Gu Incheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/649,058

(22) PCT Filed: Mar. 20, 2013

(86) PCT No.: PCT/KR2013/002302
§ 371 (c)(1),
(2) Date: Jun. 2, 2015

(87) PCT Pub. No.: WO2014/088159
PCT Pub. Date: Jun. 12, 2014

(65) Prior Publication Data
US 2015/0316687 A1    Nov. 5, 2015

(30) Foreign Application Priority Data
Dec. 3, 2012 (KR) ........................ 10-2012-0139155

(51) Int. Cl.
| | |
|---|---|
| *G02B 5/23* | (2006.01) |
| *G02B 1/04* | (2006.01) |
| *G03F 7/04* | (2006.01) |
| *C09B 11/12* | (2006.01) |
| *C09B 69/10* | (2006.01) |
| *G02B 5/22* | (2006.01) |
| *G02F 1/1335* | (2006.01) |
| *G03F 1/00* | (2012.01) |
| *C08F 10/00* | (2006.01) |
| *C08F 132/08* | (2006.01) |
| *C08F 136/00* | (2006.01) |
| *C08F 232/08* | (2006.01) |
| *C08F 236/00* | (2006.01) |
| *C08F 32/08* | (2006.01) |
| *C08F 36/00* | (2006.01) |

(52) U.S. Cl.
CPC . *G02B 1/04* (2013.01); *C09B 11/12* (2013.01); *C09B 69/103* (2013.01); *G02B 5/223* (2013.01); *G02B 5/23* (2013.01); *G03F 7/04* (2013.01)

(58) Field of Classification Search
USPC ........... 252/586; 349/106; 359/891; 427/514; 430/7, 270.1; 526/280
See application file for complete search history.

(56) References Cited

FOREIGN PATENT DOCUMENTS

| KR | 10-2010-0015349 | 2/2010 |
|---|---|---|
| KR | 10-2010-0121494 | 11/2010 |
| KR | 10-2011-0007982 | 1/2011 |
| KR | 10-2012-0014111 | 2/2012 |
| KR | 10-2012-0028815 | 3/2012 |
| KR | 10-2012-0095314 | 8/2012 |

*Primary Examiner* — Bijan Ahvazi
(74) *Attorney, Agent, or Firm* — Ware, Fressola, Maguire & Barber LLP

(57) ABSTRACT

The present invention relates to a polymeric triarylmethane dye, a blue resin composition for a color filter including the polymeric dye, and a color filter using the resin composition. The blue resin composition of the present invention is highly soluble in solvents and has excellent luminance, contrast, heat resistance, and chemical resistance due to the use of the polymeric triarylmethane dye. Particularly, the blue resin composition exhibits higher luminance and contrast than blue resin compositions using existing pigments. In addition, the blue resin composition of the present invention has greatly improved heat resistance and chemical resistance compared to blue resin compositions using existing triarylmethane dye monomers.

15 Claims, No Drawings

POLYMERIC TRIARYLMETHANE DYE, BLUE RESIN COMPOSITION INCLUDING FOR COLOR FILTER INCLUDING THE POLYMERIC DYE AND COLOR FILTER USING THE RESIN COMPOSITION

CROSS-REFERENCE TO RELATED APPLICATIONS

This application is a U.S. national stage of International Appl. No. PCT/KR2013/002302 filed 20 Mar. 2013, which claimed priority to Korean Appl. No. 10-2012-0139155 filed 3 Dec. 2012, which applications are incorporated herein by reference in their entireties.

TECHNICAL FIELD

The present invention relates to a polymeric triarylmethane dye, a blue resin composition for a color filter including the polymeric dye, and a color filter using the resin composition. More specifically, the present invention relates to a polymeric triarylmethane dye with superior heat resistance and chemical resistance.

BACKGROUND

Liquid crystal display devices display images taking advantage of the optical and electrical properties of liquid crystal materials. Liquid crystal display devices have many advantages, such as light weight, low power consumption, and low driving voltage, in comparison with CRTs, plasma display panels, etc. A liquid crystal display device includes a liquid crystal layer interposed between glass substrates. Light generated from a light source passes through the liquid crystal layer where the light transmittance is controlled. The light having passed through the liquid crystal passes through a color filter layer. The liquid crystal display device uses the light having passed through the color filter layer to realize full-color images on a screen based on additive color mixing.

Dyeing, printing, electrodeposition, and pigment dispersion are generally known as methods of producing color filters for liquid crystal display devices. Dyeing methods have been explored in the past. However, dyeing methods are difficult to apply to the production of color filters because dyes are inferior in resistance to external factors, including heat, light, and chemicals, to pigments. Dyeing methods involve complicated processing steps, thus lacking economic efficiency. In view of these disadvantages, pigment dispersion is generally applied to the production of color filters at present. The lower transmittances of pigments than dyes have been overcome by advanced techniques for the micronization and dispersion of pigments. Color filters produced by pigment dispersion are stable against external factors, such as light, heat, and solvents, due to the use of pigments. Pigment dispersion facilitates the production of color filters for large-screen high-precision color displays by photolithographic patterning. For this reason, pigment dispersion is presently the most widely used method. Pigment dispersion using pigments requires a large number of additives to stabilize the state of the pigments and micronize the pigment powders. Further, pigment dispersion involves very laborious and troublesome processes.

As an alternative to pigment dispersion, the use of colorants as mixtures of pigments and dyes was considered to achieve improved physical properties. The colorants contributed to improvements of luminance and contrast to some extent, but the above-mentioned problems of the pigments were inevitable due to the addition of the dyes to the pigments, and as a result, the improved luminance and contrast were not as satisfactory as expected.

Under these circumstances, research aimed at the development of new dye compounds has recently been conducted to achieve high luminance, contrast, and resolution. Dyes can be used to produce color resists in a simpler manner than pigments while eliminating the problems of poor dispersibility and aggregation of pigments.

Particularly, numerous attempts have been made to use triarylmethane dyes, which are dye compounds under active development. The triarylmethane dyes are effective in achieving improved luminance and contrast due to their high transmittance at 420 to 450 nm but have low solubility in solvents used in coloring compositions for color filters and are poorly resistant to heat.

SUMMARY OF THE INVENTION

The present invention has been made in view of the above problems, and it is an object of the present invention to provide a polymeric triarylmethane dye whose solubility in solvents is high and whose heat resistance and chemical resistance are improved compared to general triarylmethane dyes to reach levels comparable to those of pigments. It is another object of the present invention to provide a coloring resin composition that uses the polymeric triarylmethane dye to enable the production of a color filter with higher luminance and contrast than resin compositions using existing pigments.

According to one aspect of the present invention, there is provided a polymeric triarylmethane dye including a structure represented by Formula 1:

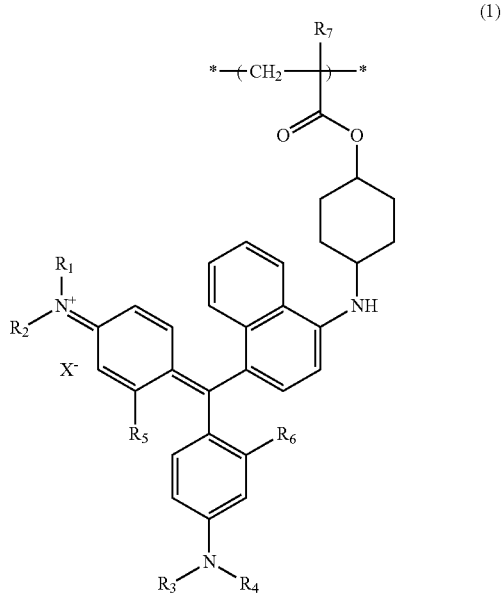

(1)

wherein $X^-$ is a trifluoromethanesulfonic acid or bistrifluoromethanesulfonimide anion, $R_1$, $R_2$, $R_3$, and $R_4$ are each independently selected from hydrogen, substituted or unsubstituted $C_1$-$C_{18}$ alkyl groups, and substituted or unsubstituted $C_6$-$C_{10}$ aromatic hydrocarbons, and $R_5$, $R_6$, and $R_7$ are each independently hydrogen or methyl; and optionally at least one structure selected from the group consisting of structures represented by Formulae 2 to 5:

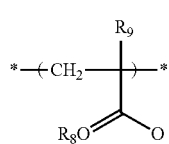
(2)

wherein $R_8$ is selected from hydrogen, substituted or unsubstituted $C_1$-$C_{18}$ alkyl groups, and substituted or unsubstituted $C_6$-$C_{10}$ aromatic hydrocarbons and $R_9$ is hydrogen or methyl,

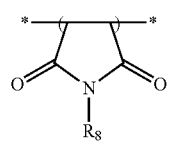
(3)

wherein $R_8$ is as defined in Formula 2,

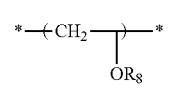
(4)

wherein $R_8$ is as defined in Formula 2, and

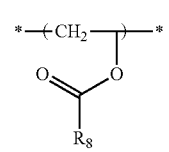
(5)

wherein $R_8$ is as defined in Formula 2.

A monomer corresponding to the structure of Formula 1 constituting the polymeric dye may be a unit compound represented by Formula 6:

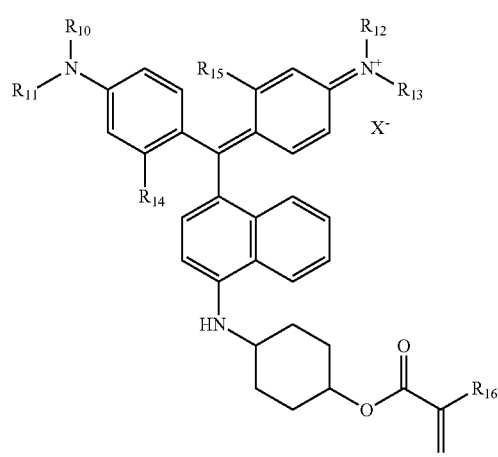
(6)

wherein $X^-$ is a trifluoromethanesulfonic acid or bistrifluoromethanesulfonimide anion, $R_{10}$, $R_{11}$, $R_{12}$, and $R_{13}$ are each independently selected from hydrogen, substituted or unsubstituted $C_1$-$C_{18}$ alkyl groups, and substituted or unsubstituted $C_6$-$C_{10}$ aromatic hydrocarbons, and $R_{14}$, $R_{15}$, and $R_{16}$ are each independently hydrogen or methyl.

A monomer corresponding to the structure of Formula 2 constituting the polymeric dye may be a unit compound represented by Formula 7:

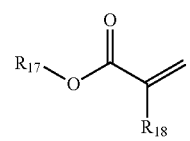
(7)

wherein $R_{17}$ is selected from hydrogen, substituted or unsubstituted $C_1$-$C_{18}$ alkyl groups, and substituted or unsubstituted $C_6$-$C_{10}$ aromatic hydrocarbons and $R_{18}$ is hydrogen or methyl.

A monomer corresponding to the structure of Formula 3 constituting the polymeric dye may be a unit compound represented by Formula 8:

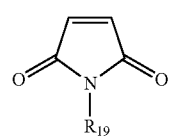
(8)

wherein $R_{19}$ is selected from hydrogen, substituted or unsubstituted $C_1$-$C_{18}$ alkyl groups, and substituted or unsubstituted $C_6$-$C_{10}$ aromatic hydrocarbons.

A monomer corresponding to the structure of Formula 4 constituting the polymeric dye may be a unit compound represented by Formula 9:

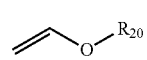
(9)

wherein $R_{20}$ is selected from hydrogen, substituted or unsubstituted $C_1$-$C_{18}$ alkyl groups, and substituted or unsubstituted $C_6$-$C_{10}$ aromatic hydrocarbons.

A monomer corresponding to the structure of Formula 5 constituting the polymeric dye may be a unit compound represented by Formula 10:

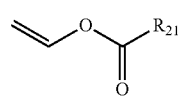
(10)

wherein $R_{21}$ is selected from hydrogen, substituted or unsubstituted $C_1$-$C_{18}$ alkyl groups, and substituted or unsubstituted $C_6$-$C_{10}$ aromatic hydrocarbons.

According to one embodiment of the present invention, the polymeric dye may have a weight average molecular weight (Mw) of 2,000 to 150,000.

According to a further aspect of the present invention, there is provided a blue resin composition for a color filter including a blue colorant, a binder resin, a reactive unsaturated compound, a polymerization initiator, an organic solvent, and an additive wherein the blue colorant is the polymeric triarylmethane dye.

The blue resin composition further includes, as another blue colorant, at least one dye selected from the group consisting of xanthene dyes, cyanine dyes, and azaporphyrin dyes.

The blue resin composition further includes at least one pigment selected from the group consisting of blue pigments and violet pigments.

The blue colorant is present in an amount of 0.01% to 50% by weight, based on the total weight of the blue resin composition.

The reactive unsaturated compound is selected from the group consisting of heat-curable monomers and oligomers, photocurable monomers and oligomers, and combinations thereof.

The polymerization initiator is selected from the group consisting of thermal polymerization initiators, photopolymerization initiators, and combinations thereof.

According to another aspect of the present invention, there is provided a color filter produced using the blue resin composition.

The polymeric triarylmethane dye of the present invention can be used to prepare a blue resin composition for a color filter with excellent luminance, contrast, heat resistance, and chemical resistance. Particularly, the blue resin composition including the polymeric triarylmethane dye exhibits higher luminance and contrast than blue resin compositions using existing pigments. In addition, the blue resin composition including the polymeric triarylmethane dye has greatly improved heat resistance and chemical resistance compared to blue resin compositions using existing triarylmethane dyes.

DETAILED DESCRIPTION OF THE INVENTION

The present inventors have conducted a series of experiments to synthesize polymeric triarylmethane dyes that are highly soluble in organic solvents such as propylene glycol ether acetate monomethyl ether acetate (PGMEA) and have superior heat resistance and chemical resistance.

Specifically, the present invention provides a polymeric triarylmethane dye essentially including a triarylmethane dye structure represented by Formula 1:

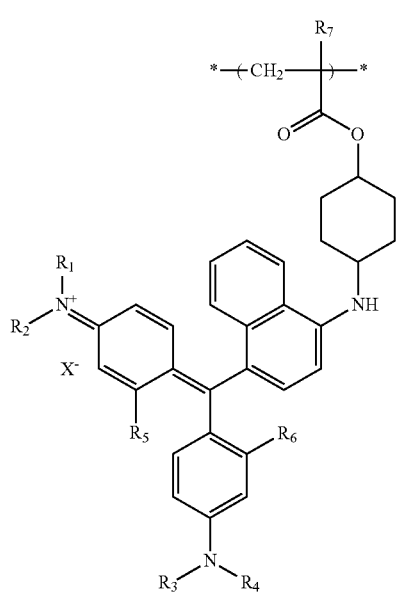

(1)

wherein $X^-$ is a trifluoromethanesulfonic acid or bistrifluoromethanesulfonimide anion, $R_1$, $R_2$, $R_3$, and $R_4$ are each independently selected from hydrogen, substituted or unsubstituted $C_1$-$C_{18}$ alkyl groups, and substituted or unsubstituted $C_6$-$C_{10}$ aromatic hydrocarbons, and $R_5$, $R_6$, and $R_7$ are each independently hydrogen or methyl.

The polymeric triarylmethane dye of the present invention may optionally further include at least one structure selected from the group consisting of structures represented by Formulae 2 to 5:

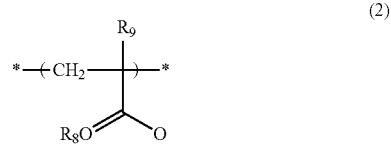

(2)

wherein $R_8$ is selected from hydrogen, substituted or unsubstituted $C_1$-$C_{18}$ alkyl groups, and substituted or unsubstituted $C_6$-$C_{10}$ aromatic hydrocarbons and $R_9$ is hydrogen or methyl;

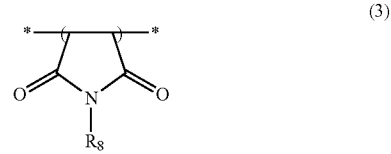

(3)

wherein $R_8$ is as defined in Formula 2;

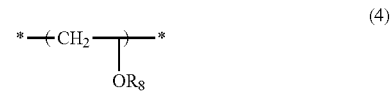

(4)

wherein $R_8$ is as defined in Formula 2; and

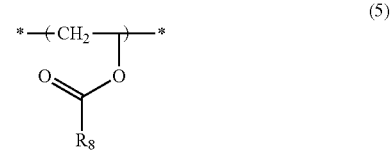

(5)

wherein $R_8$ is as defined in Formula 2.

Preferably, the polymeric triarylmethane dye has a weight average molecular weight (Mw) of 2,000 to 150,000. If the polymeric triarylmethane dye has a molecular weight lower than 2,000, its chemical resistance may deteriorate. Meanwhile, if the polymeric triarylmethane dye has a molecular weight exceeding 150,000, its solubility in solvents may become poor. The weight average molecular weight (Mw) of the polymeric triarylmethane dye is more preferably in the range of 2,000 to 30,000. Within this range, the polymeric triarylmethane dye is excellent in solubility, luminance, contrast, heat resistance, and chemical resistance.

A monomeric compound corresponding to the triarylmethane dye structure of Formula 1 may be represented by Formula 6:

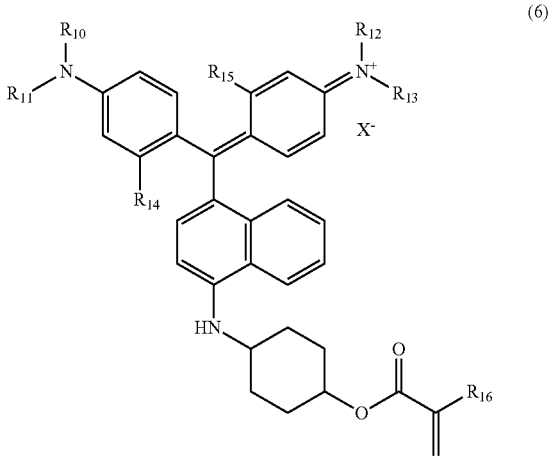

(6)

wherein X⁻ is a trifluoromethanesulfonic acid or bistrifluoromethanesulfonimide anion, $R_{10}$, $R_{11}$, $R_{12}$, and $R_{13}$ are each independently selected from hydrogen, substituted or unsubstituted $C_1$-$C_{18}$ alkyl groups, and substituted or unsubstituted $C_6$-$C_{10}$ aromatic hydrocarbons, and $R_{14}$, $R_{15}$, and $R_{16}$ are each independently hydrogen or methyl.

A monomeric compound corresponding to the structure of Formula 2 may be a polymerizable compound represented by Formula 7:

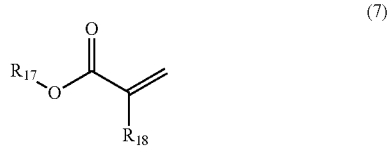

(7)

wherein $R_{17}$ is selected from hydrogen, substituted or unsubstituted $C_1$-$C_{18}$ alkyl groups, and substituted or unsubstituted $C_6$-$C_{10}$ aromatic hydrocarbons and $R_{18}$ is hydrogen or methyl.

The compound of Formula 7 is preferably selected from the group consisting of acrylic acid, methyl acrylate, ethyl acrylate, butyl acrylate, hexyl acrylate, isobutyl acrylate, decyl acrylate, lauryl acrylate, octadecyl acrylate, 2-ethylhexyl acrylate, isobornyl acrylate, 2-hydroxyethyl acrylate, hydroxypropyl acrylate, tetrahydrofurfuryl acrylate, ethylene glycol methyl ether acrylate, 2-ethoxyethyl acrylate, cinnamyl acrylate, methyl methacrylate, ethyl methacrylate, benzyl methacrylate, butyl methacrylate, hexyl methacrylate, 2-ethylhexyl methacrylate, allyl methacrylate, vinyl methacrylate, 2-(diethylamino)ethyl methacrylate, isobornyl methacrylate, 2-hydroxyethyl methacrylate, cyclohexyl methacrylate, cinnamyl methacrylate, and combinations thereof.

A monomeric compound corresponding to the structure of Formula 3 may be a polymerizable compound represented by Formula 8:

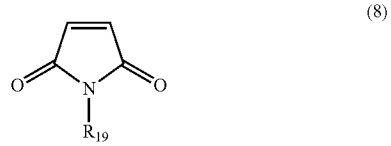

(8)

wherein $R_{19}$ is selected from hydrogen, substituted or unsubstituted $C_1$-$C_{18}$ alkyl groups, and substituted or unsubstituted $C_6$-$C_{10}$ aromatic hydrocarbons.

The compound of Formula 8 is preferably selected from the group consisting of maleimide, N-methylmaleimide, N-ethylmaleimide, N-benzylmaleimide, N-phenylmaleimide, N-cyclohexylmaleimide, and combinations thereof.

A monomeric compound corresponding to the structure of Formula 4 may be a polymerizable compound represented by Formula 9:

(9)

wherein $R_{20}$ is selected from hydrogen, substituted or unsubstituted $C_1$-$C_{18}$ alkyl groups, and substituted or unsubstituted $C_6$-$C_{10}$ aromatic hydrocarbons.

The compound of Formula 9 is preferably selected from the group consisting of propyl vinyl ether, butyl vinyl ether, isobutyl vinyl ether, cyclohexyl vinyl ether, 2-ethylhexyl vinyl ether, dodecyl vinyl ether, ethylene glycol vinyl ether, di(ethylene glycol) vinyl ether, and combinations thereof.

A monomeric compound corresponding to the structure of Formula 5 may be a polymerizable compound represented by Formula 10:

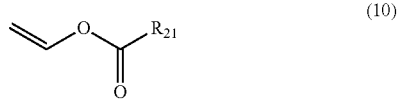

(10)

wherein $R_{21}$ is selected from hydrogen, substituted or unsubstituted $C_1$-$C_{18}$ alkyl groups, and substituted or unsubstituted $C_6$-$C_{10}$ aromatic hydrocarbons.

The compound of Formula 10 is preferably selected from the group consisting of vinyl acetate, vinyl propionate, vinyl butyrate, vinyl hexanoate, vinyl octanoate, vinyl decanoate, vinyl laurate, vinyl stearate, vinyl methacrylate, vinyl cinnamate, vinyl benzoate, vinyl chloroacetate, vinyl crotonate, vinyl 2-ethylhexanoate, and combinations thereof.

In a further aspect, the present invention provides a blue resin composition for a color filter which uses the polymeric triarylmethane dye as a blue colorant and includes a binder resin, a reactive unsaturated compound, a polymerization initiator, an organic solvent, and an additive. The blue resin composition may optionally further include a dye or pigment as another blue colorant.

The polymeric triarylmethane dye as a blue colorant, and optionally together with at least one dye or pigment as another blue colorant, is preferably present in an amount ranging from 0.01% to 50% by weight, based on the total weight of the blue resin composition. Within this range, the blue resin composition has high solubility in solvents and is excellent in luminance, heat resistance, and chemical resistance.

The blue resin composition may further include, as another blue colorant, at least one dye selected from the group consisting of xanthene dyes, cyanine dyes, and azaporphyrin dyes, in addition to the polymeric triarylmethane dye.

The blue resin composition may optionally further include a blue pigment or a violet pigment. The blue pigment may be used without particular limitation and may be any of those that are generally used in conventional color resin compositions for color filters. The blue pigment is preferably a copper phthalocyanine-based blue pigment. More preferably, the blue pigment is selected from Color Index (C.I.) Pigment Blues 1, 15, 15:1, 15:2, 15:3, 15:4, 15:6, 16, and 60, which are compounds classified as pigments in the Color Index (C.I.) published by the Society of Dyers and Colourists. The violet pigment may be Color Index Pigment Violet 23.

The use of the dye according to the present invention allows the blue resin composition to have a high transmittance at 420 nm to 450 nm, leading to high luminance.

Any adherent resin may be used without particular limitation as the binder resin. A known film-forming resin is particularly useful as the binder resin.

Examples of binder resins suitable for use in the blue resin composition include: cellulose resins, particularly carboxymethyl hydroxyethyl cellulose and hydroxyethyl cellulose; and binders, such as acrylic acid resins, alkyd resins, melamine resins, epoxy resins, polyvinyl alcohol, polyvinylpyrrolidone, polyamide, polyamide-imine, and polyimide.

Useful binders include resins having photopolymerizable unsaturated bonds and may be, for example, acrylic acid resins. Particularly useful are homopolymers and copolymers of polymerizable monomers, for example, copolymers of carboxyl group-containing polymerizable monomers, such as methyl methacrylate, ethyl methacrylate, propyl methacrylate, butyl methacrylate, styrene, styrene derivatives, methacrylic acid, itaconic acid, maleic acid, maleic anhydride, and monoalkyl maleate, and polymerizable monomers, such as methacrylic acid, styrene, and styrene derivatives.

Examples of such binders include: reaction products of compounds containing an oxirane ring and an ethylenically unsaturated bond, such as glycidyl methacrylate, acryloyl glycidyl ether, and monoalkyl glycidyl itaconates, with carboxyl group-containing polymerizable compounds; and reaction products of compounds containing a hydroxyl group and an ethylenically unsaturated bond (e.g., unsaturated alcohols), such as allyl alcohol, 2-buten-4-ol, oleyl alcohol, 2-hydroxyethyl methacrylate, and N-methylol acrylamide, with carboxyl group-containing polymerizable compounds. Such binders may also contain an unsaturated compound having no isocyanate group.

The equivalence of unsaturation of the binders (the molecular weight of the binder per unsaturated compound) is typically in the range of 200 to 3,000, particularly in the range of 230 to 1,000. Within this range, not only adequate photopolymerizability but also satisfactory film hardness can be provided. The acid value of the binders is typically in the range of 20 to 300, particularly 40 to 200. Within this range, sufficient alkali developability can be provided after film exposure. The average molecular weight of the binders is preferably from 1,500 to 200,000, particularly from 10,000 to 50,000 g/mol.

The reactive unsaturated compound may be selected from the group consisting of heat-curable monomers and oligomers, photocurable monomers and oligomers, and combinations thereof. The reactive unsaturated compound is preferably a photocurable monomer and may contain one or more reactive double bonds and one or more additional reactive groups in the molecule.

In this context, particularly useful photocurable monomers are reactive solvents and reactive diluents and examples thereof include mono-, di-, tri-, and polyfunctional acrylates and methacrylates, vinyl ethers, and glycidyl ethers. The additional reactive groups include allyl, hydroxyl, phosphate, urethane, secondary amine, N-alkoxymethyl groups.

Monomers of this kind are known in the art, for example, in Roempp, Lexikon, Lacke and Druckfarben, Dr. Ulrich Zorll, Thimem Verlag Stuttgart-New York, 1998, p 491/492. The choice of the monomers is particularly determined by the kind and intensity of irradiation, the desired reaction with the photoinitiator, and the characteristics of a film to be formed. These photocurable monomers may be used alone or in combination thereof.

The polymerization initiator may be a heat curing initiator, a photocuring initiator or a combination thereof. Preferably, the polymerization initiator is a photocuring initiator. The photocuring initiator refers to a compound that forms an intermediate capable of inducing a polymerization reaction, for example, of the monomers and/or binders as a result of UV absorption. The polymerization initiator is also known in the art and can be found, for example, in Roempp, Lexikon, Lacke and Druckfarben, Dr. Ulrich Zorll, Thimem Verlag Stuttgart-New York, 1998, p 445/446.

For example, the organic solvent may be selected from ketones, alkylene glycol ethers, alcohols, and aromatic compounds. Examples of the ketones include acetone, methyl ethyl ketone, and cyclohexanone. Examples of the alkylene glycol ethers include methylcellosolve (ethylene glycol monomethyl ether), butylcellosolve (ethylene glycol monobutyl ether), methylcellosolve acetate, ethylcellosolve acetate, butylcellosolve acetate, ethylene glycol monopropyl ether, ethylene glycol monohexyl ether, ethylene glycol dimethyl ether, diethylene glycol ethyl ether, propylene glycol monomethyl ether, propylene glycol monoethyl ether, propylene glycol monopropyl ether, propylene glycol monobutyl ether, propylene glycol monomethyl ether acetate diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol, triethylene glycol butyl ether acetate, and triethylene glycol t-butyl ether acetate. Examples of the alcohols include methyl alcohol, ethyl alcohol, isopropyl alcohol, n-butyl alcohol, and 3-methyl-3-methoxybutanol. Examples of the aromatic compounds include benzene, toluene, xylene, N-methyl-2-pyrrolidone, and ethyl N-hydroxymethylpyrrolidone-2-acetate. Other examples of solvents suitable for use in the blue resin composition include 1,2-propanediol diacetate, 3-methyl-3-methyl-3methoxybutyl acetate, ethyl acetate, and tetrahydrofuran. These solvents may be used alone or as a mixture thereof.

The additive may be used without limitation so long as the objects of the present invention are not impaired. The additive is used to achieve improved surface texture. The additive is preferably a fatty acid, a fatty amine, an alcohol, bean oil, a wax, rosin, resin or a benzotriazole derivative. More preferably, the fatty acid is stearic acid or behenic acid and the fatty amine is stearylamine.

The present invention will be explained in detail in such a manner that those with ordinary knowledge in the art can easily carry out the invention with reference to the following examples. However, the present invention is not limited to the illustrated embodiments and may be embodied in various different forms.

EXAMPLE 1

Synthesis of Polymeric Triarylmethane Compounds

The compounds of Formulae 11, 12, 13, and 14 were chosen as monomeric compounds that can be represented by Formula 6 corresponding to the triarylmethane dye structure represented by Formula 1.

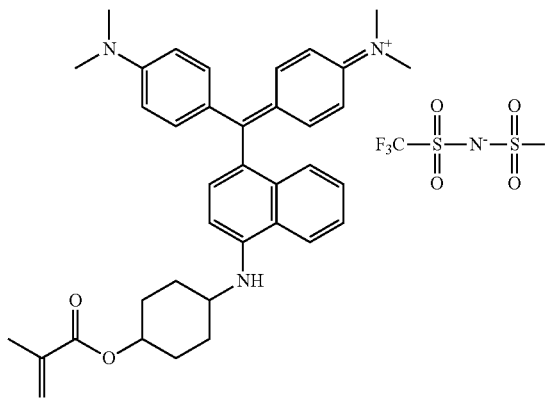
(11)

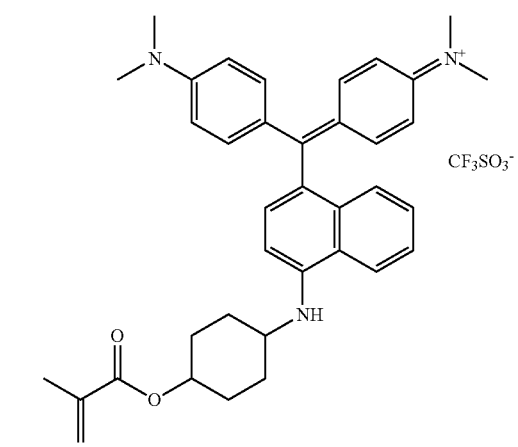
(12)

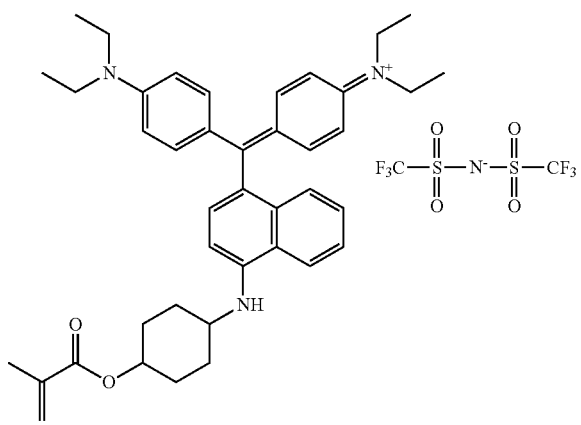
(13)

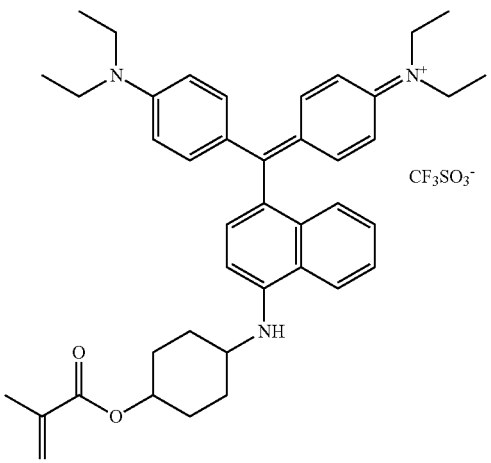
(14)

Each of the compounds of Formulae 11, 12, 13, and 14 was polymerized to synthesize a homopolymeric triarylmethane dye.

At least one compound selected from the group consisting of the monomeric polymerizable compounds of Formulae 7 to 10, which correspond to the structures of Formulae 2 to 5, respectively, was polymerized with at least one compound selected from the group consisting of the compounds of Formulae 11 to 14 to synthesize a copolymeric triarylmethane dye.

In the following table 1, "a)", "b)", "c)", and "d)" indicate the compounds of Formulae 11, 12, 13, and 14, respectively, and "e)", "f)", "g)", "h)", "i)", "j)", and "k)" belonging to the compounds of Formulae 7 to 10 indicate the following compounds:

e) 2-Ethylhexyl methacrylate
f) Methacrylic acid
g) N-phenylmaleimide
h) Cinnamyl methacrylate
i) Butyl vinyl ether
j) Vinyl cinnamate
k) Vinyl acetate

SYNTHESIS EXAMPLE 1

16.67 g of methyl ethyl ketone was heated to reflux under a nitrogen atmosphere in a 50 mL flask equipped with a reflux condenser. A solution of 3.00 g of the triarylmethane dye compound (c) and 0.48 g of azobisisobutyronitrile (AIBN) as a polymerization initiator in 16.67 g of methyl ethyl ketone was added dropwise to the reaction flask over 2 h. The mixture was refluxed for another 14 h. After completion of the polymerization, the reaction mixture was cooled to room temperature, concentrated under reduced pressure, and dried under vacuum, yielding a polymeric triarylmethane dye having a number average molecular weight of 2210, a weight average molecular weight of 3435, and a dispersity of 1.55.

SYNTHESIS EXAMPLE 2

16.67 g of methyl ethyl ketone was heated to reflux under a nitrogen atmosphere in a 50 mL flask equipped with a reflux condenser. A solution of 3.00 g of the triarylmethane dye compound (a), 0.96 g of 2-ethylhexyl methacrylate (e), 0.96 g of methacrylic acid (f), 0.60 g of N-phenylmaleimide (g), and 0.48 g of azobisisobutyronitrile (AIBN) as a polymerization initiator in 16.67 g of methyl ethyl ketone was added dropwise to the reaction flask over 2 h. The mixture was refluxed for another 14 h. After completion of the polymerization, the reaction mixture was cooled to room temperature, concentrated under reduced pressure, and dried under vacuum, yielding a polymeric triarylmethane dye having a number average molecular weight of 3343, a weight average molecular weight of 7601, and a dispersity of 2.27.

SYNTHESIS EXAMPLES 3-7

Polymeric compounds were synthesized in the same manner as in Synthesis Example 2, except that the compounds a)-k) were used as shown in Table 1.

TABLE 1

| Compound | Synthesis Example 1 | Synthesis Example 2 | Synthesis Example 3 | Synthesis Example 4 | Synthesis Example 5 | Synthesis Example 6 | Synthesis Example 7 |
|---|---|---|---|---|---|---|---|
| a) | | 3.0 g | | | | | |
| b) | | | 3.0 g | | | | |
| c) | 3.0 g | | | 3.0 g | | 3.0 g | 3.0 g |
| d) | | | | | 3.0 g | | |
| e) | | 0.96 g | 0.96 g | 0.96 g | 0.96 g | | 0.60 g |
| f) | | 0.96 g | 0.96 g | 0.96 g | 0.96 g | 0.60 g | |
| g) | | 0.60 g | 0.60 g | 0.60 g | 0.60 g | | |
| h) | | | | | | 0.96 g | |
| i) | | | | | | 0.96 g | |
| j) | | | | | | | 0.96 g |
| k) | | | | | | | 0.96 g |
| AIBN | 0.48 g | 0.48 g | 0.48 g | 0.48 g | 0.48 g | 0.48 g | 0.48 g |
| Number average molecular weight | 2210 | 3343 | 3529 | 4429 | 3312 | 3738 | 2706 |
| Weight average molecular weight | 3435 | 7601 | 11422 | 20318 | 5330 | 10763 | 6308 |
| Dispersity | 1.55 | 2.27 | 3.24 | 4.59 | 1.61 | 2.88 | 2.33 |

EXAMPLE 2

Preparation of Blue Resin Compositions for Color Filters

EXAMPLE 2-1

1.4 g of a copolymer (Mw=20000) of benzyl methacrylate and methacrylic acid in a weight ratio of 60:40 as a binder resin, 5 g of dipentaerythritol hexaacrylate as an acrylic monomer, 1.9 g of the polymeric triarylmethane dye prepared in Synthesis Example 1, 1 g of Irgacure OXE-01 (BASF) as a photopolymerization initiator, and 40.7 g of propylene glycol monomethyl ether acetate as a solvent were mixed together. The mixture was stirred for 2 h to prepare a photosensitive blue resin composition for a color filter.

EXAMPLE 2-2

A blue resin composition for a color filter was prepared in the same manner as in Example 2-1, except that 1.9 g of the polymeric triarylmethane dye prepared in Synthesis Example 2 was used as a blue dye compound.

EXAMPLE 2-3

A blue resin composition for a color filter was prepared in the same manner as in Example 2-1, except that 1.9 g of the polymeric triarylmethane dye prepared in Synthesis Example 3 was used as a blue dye compound.

EXAMPLE 2-4

A blue resin composition for a color filter was prepared in the same manner as in Example 2-1, except that 1.9 g of the polymeric triarylmethane dye prepared in Synthesis Example 4 was used as a blue dye compound.

EXAMPLE 2-5

A blue resin composition for a color filter was prepared in the same manner as in Example 2-1, except that 1.9 g of the polymeric triarylmethane dye prepared in Synthesis Example 5 was used as a blue dye compound.

EXAMPLE 2-6

A blue resin composition for a color filter was prepared in the same manner as in Example 2-1, except that 1.9 g of the polymeric triarylmethane dye prepared in Synthesis Example 6 was used as a blue dye compound.

EXAMPLE 2-7

A blue resin composition for a color filter was prepared in the same manner as in Example 2-1, except that 1.9 g of the polymeric triarylmethane dye prepared in Synthesis Example 7 was used as a blue dye compound.

COMPARATIVE EXAMPLES

Comparative Example 1

A blue resin composition for a color filter was prepared in the same manner as in Example 2-1, except that 1.36 g of C.I. Blue Pigment 15:6 and 0.54 g of C.I. Violet Pigment 23 were used instead of the polymeric triarylmethane dye prepared in Synthesis Example 1 as a blue dye compound.

COMPARATIVE EXAMPLE 2

A blue resin composition for a color filter was prepared in the same manner as in Example 2-1, except that 1.9 g of the triarylmethane dye compound represented by Formula 12 was used instead of the polymeric triarylmethane dye prepared in Synthesis Example 1 as a blue dye compound.

EXPERIMENTAL EXAMPLES

Experimental Example 1

Luminance and Contrast Measurements

Each of the compositions prepared in Examples 2-1 to 2-7 and Comparative Examples 1 and 2 was applied to a 0.7 mm thick glass substrate by using a spin coater. The coated substrate was pre-baked on a hot plate at 100° C. for 150 s, followed by exposure using an exposure device (300 W, 365 nm) for 10 s. Thereafter, the resulting structure was post-baked by drying in a hot air oven at 220° C. for 30 min to construct a specimen. The luminance and contrast of the specimen were measured using a spectrophotometer (MCPD3700, Otsuka electronic) and a contrast meter (CT-1, Tsubosaka), respectively. The results are shown in Table 2.

Experimental Example 2

Heat Resistance Measurements

Specimens were prepared in the same manner as in Experimental Example 1. The specimens were cut into smaller pieces. Changes in the color characteristics of the pieces were observed before and after annealing in a convection oven at 220° C. for 1 h. The results are shown in Table 2.

Experimental Example 3

Chemical Resistance Measurements

Specimens were prepared in the same manner as in Experimental Example 1. Each of the specimens was cut into two pieces. One of the pieces was dipped in propylene glycol monomethyl ether acetate (PGMEA) at 80° C. for 30 min. The other piece was dipped in a mixture of methyl 3-methoxypropionate (MMP) and ethylene glycol dimethyl ester (DIGLYME) (8:2 (v/v)) as a solvent at room temperature for 30 min Changes in the color characteristics of the pieces were observed before and after the dipping. The results are shown in Table 2.

Table 2 shows the results of luminance, contrast, heat resistance, and chemical resistance measured in Experimental Examples 1-3.

As can be seen from the results in Table 2, the specimens of the compositions prepared in Examples 2-1 to 2-7 showed greatly improved luminance and contrast values compared to the specimens of the composition prepared using the pigments in Comparative Example 1.

Further, insignificant differences were observed in heat resistance and chemical resistance between the compositions of Examples 2-1 to 2-7 and the composition prepared using the pigments in Comparative Example 1.

Further, there were no significant differences in luminance and contrast between the compositions of Examples 2-1 to 2-7 and the composition of Comparative Example 2, but the heat resistance and chemical resistance of the compositions of Examples 2-1 to 2-7 were greatly improved compared to those of the composition prepared using the existing triarylmethane dye monomer in Comparative Example 2, demonstrating that the advantageous effects of the compositions of Examples 2-1 to 2-7 was attributed to the use of the polymeric triarylmethane dyes.

These results lead to the conclusion that the use of the compositions prepared using the polymeric triarylmethane dyes as blue colorants in Examples 2-1 to 2-7 enables the production of color filters with greatly improved luminance and contrast compared to those of color filters produced using the existing pigment compounds.

Although the present invention has been described herein with reference to its preferred embodiments, it is not limited to the embodiments. It should be understood that various modifications are possible without departing from the spirit of the invention and such modifications are encompassed within the scope of the appended claims.

INDUSTRIAL APPLICABILITY

As is apparent from the foregoing, the polymeric triarylmethane dye of the present invention can be used to prepare a blue resin composition for a color filter with excellent luminance, contrast, heat resistance, and chemical resistance. Particularly, the blue resin composition including the polymeric triarylmethane dye exhibits higher luminance and contrast than blue resin compositions using existing pigments. In addition, the blue resin composition including the polymeric triarylmethane dye has greatly improved heat resistance and chemical resistance compared to blue resin compositions using existing triarylmethane dyes.

TABLE 2

| Example No. | x | y | Luminance | Contrast | Heat resistance, $\Delta Eab^*$ | Chemical resistance, $\Delta Eab^*$ | |
|---|---|---|---|---|---|---|---|
| | | | | | | PGMEA | MMP/DIGLYME |
| Example 2-1 | 0.1410 | 0.113 | 15.08 | 15600 | 1.71 | 0.29 | 1.07 |
| Example 2-2 | 0.1425 | 0.113 | 15.24 | 17980 | 1.38 | 0.17 | 0.67 |
| Example 2-3 | 0.143 | 0.113 | 15.17 | 16803 | 1.50 | 0.24 | 0.81 |
| Example 2-4 | 0.1397 | 0.113 | 15.63 | 18914 | 1.20 | 0.18 | 0.52 |
| Example 2-5 | 0.1405 | 0.113 | 15.40 | 17569 | 1.16 | 0.22 | 0.81 |
| Example 2-6 | 0.1395 | 0.113 | 15.51 | 19311 | 1.24 | 0.16 | 0.44 |
| Example 2-7 | 0.1407 | 0.113 | 15.68 | 18128 | 1.07 | 0.18 | 0.64 |
| Comparative Example 1 | 0.1365 | 0.113 | 13.70 | 11020 | 1.04 | 0.15 | 0.47 |
| Comparative Example 2 | 0.1399 | 0.113 | 15.36 | 19755 | 8.73 | 25.51 | 58.67 |

The invention claimed is:

1. A polymeric triarylmethane dye comprising a structure represented by Formula 1:

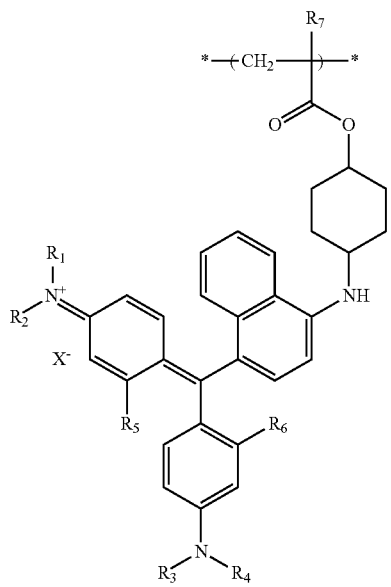
(1)

wherein $X^-$ is a trifluoromethanesulfonic acid or bistrifluoromethanesulfonimide anion, $R_1$, $R_2$, $R_3$, and $R_4$ are each independently selected from the group consisting of hydrogen, substituted or unsubstituted $C_1$-$C_{18}$ alkyl groups, and substituted or unsubstituted $C_6$-$C_{10}$ aromatic hydrocarbons, and $R_5$, $R_6$, and $R_7$ are each independently hydrogen or methyl.

2. The polymeric triarylmethane dye according to claim 1, further comprising at least one structure selected from the group consisting of structures represented by Formulae 2 to 5:

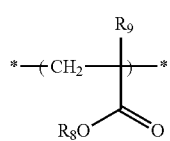
(2)

wherein $R_8$ is selected from the group consisting of hydrogen, substituted or unsubstituted $C_1$-$C_{18}$ alkyl groups, and substituted or unsubstituted $C_6$-$C_{10}$ aromatic hydrocarbons and $R_9$ is hydrogen or methyl;

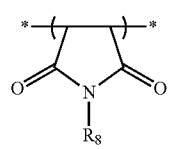
(3)

wherein $R_8$ is as defined in Formula 2;

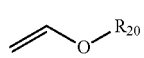
(4)

wherein $R_8$ is as defined in Formula 2; and

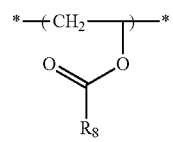
(5)

wherein $R_8$ is as defined in Formula 2.

3. The polymeric triarylmethane dye according to claim 2, wherein the structure of Formula 2 is a unit compound represented by Formula 7:

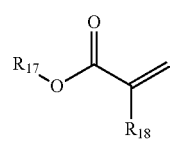
(7)

wherein $R_{17}$ is selected from the group consisting of hydrogen, substituted or unsubstituted $C_1$-$C_{18}$ alkyl groups, and substituted or unsubstituted $C_6$-$C_{10}$ aromatic hydrocarbons, and $R_{18}$ is hydrogen or methyl.

4. The polymeric triarylmethane dye according to claim 2, wherein the structure of Formula 3 is a unit compound represented by Formula 8:

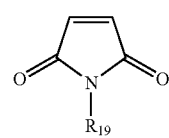
(8)

wherein $R_{19}$ is selected from the group consisting of hydrogen, substituted or unsubstituted $C_1$-$C_{18}$ alkyl groups, and substituted or unsubstituted $C_6$-$C_{10}$ aromatic hydrocarbons.

5. The polymeric triarylmethane dye according to claim 2, wherein the structure of Formula 4 is a unit compound represented by Formula 9:

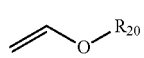
(9)

wherein $R_{20}$ is selected from the group consisting of hydrogen, substituted or unsubstituted $C_1$-$C_{18}$ alkyl groups, and substituted or unsubstituted $C_6$-$C_{10}$ aromatic hydrocarbons.

6. The polymeric triarylmethane dye according to claim 2, wherein the structure of Formula 5 is a unit compound represented by Formula 10:

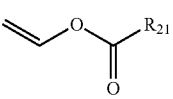
(10)

wherein $R_{21}$ is selected from hydrogen, substituted or unsubstituted $C_1$-$C_{18}$ alkyl groups, and substituted or unsubstituted $C_6$-$C_{10}$ aromatic hydrocarbons.

7. The polymeric triarylmethane dye according to claim 1, wherein the structure of Formula 1 is a unit compound represented by Formula 6:

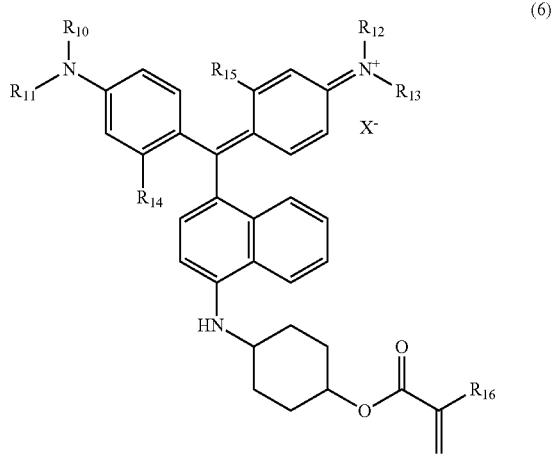

(6)

wherein $X^-$ is a trifluoromethanesulfonic acid or bistrifluoromethanesulfonimide anion, $R_{10}$, $R_{11}$, $R_{12}$, and $R_{13}$ are each independently selected from the group consisting of hydrogen, substituted or unsubstituted $C_1$-$C_{18}$ alkyl groups, and substituted or unsubstituted $C_6$-$C_{10}$ aromatic hydrocarbons, and $R_{14}$, $R_{15}$, and $R_{16}$ are each independently hydrogen or methyl.

8. The polymeric triarylmethane dye according to claim 1, wherein the polymeric dye has a weight average molecular weight (Mw) of 2,000 to 150,000.

9. A blue resin composition for a color filter comprising a blue colorant, a binder resin, a reactive unsaturated compound, a polymerization initiator, an organic solvent, and an additive wherein the blue colorant is the polymeric triarylmethane dye according to claim 1.

10. The blue resin composition according to claim 9, further comprising, as another blue colorant, at least one dye selected from the group consisting of xanthene dyes, cyanine dyes, and azaporphyrin dyes.

11. The blue resin composition according to claim 9, further comprising a blue pigment or a violet pigment.

12. The blue resin composition according to claim 9, wherein the blue colorant is present in an amount of 0.01% to 50% by weight, based on the total weight of the blue resin composition.

13. The blue resin composition according to claim 9, wherein the reactive unsaturated compound is selected from the group consisting of heat-curable monomers and oligomers, photocurable monomers and oligomers, and combinations thereof.

14. The blue resin composition according to claim 9, wherein the polymerization initiator is selected from the group consisting of thermal polymerization initiators, photopolymerization initiators, and combinations thereof.

15. A color filter produced using the blue resin composition according to claim 9.

* * * * *